United States Patent
Casey et al.

(10) Patent No.: US 6,407,901 B1
(45) Date of Patent: Jun. 18, 2002

(54) SEMICONDUCTOR DEVICE PROVIDING OVERVOLTAGE AND OVERCURRENT PROTECTION FOR A LINE

(75) Inventors: Kelly C. Casey, Flower Mound; Elmer L. Turner, Jr., Irving, both of TX (US)

(73) Assignee: Teccor Electronics, LP, Irving, TX (US)

( * ) Notice: Subject to any disclaimer, the term of this patent is extended or adjusted under 35 U.S.C. 154(b) by 0 days.

(21) Appl. No.: 09/436,114

(22) Filed: Nov. 8, 1999

Related U.S. Application Data
(60) Provisional application No. 60/130,070, filed on Apr. 19, 1999.

(51) Int. Cl.[7] .................................................. H02H 9/00
(52) U.S. Cl. ........................ 361/119; 361/111; 361/56; 361/91.1
(58) Field of Search ...................... 361/56, 111, 113, 361/91.1, 58, 119, 118, 127

(56) References Cited

U.S. PATENT DOCUMENTS

| | | | |
|---|---|---|---|
| 4,914,045 A | 4/1990 | Webb et al. ..................... 437/6 |
| 5,479,031 A | 12/1995 | Webb et al. ................. 257/173 |
| 5,516,705 A | * 5/1996 | Webb et al. ..................... 437/6 |
| 5,696,391 A | 12/1997 | Bernier ....................... 257/146 |
| 6,104,591 A | * 8/2000 | Casey et al. ................. 361/119 |

FOREIGN PATENT DOCUMENTS

EP  0 472 405 A2  2/1992  ............ H02H/9/04

OTHER PUBLICATIONS

RCA Corporation, *Thyristor and Rectifier Manual*, 1975, pp. 98–107.

Blicher, Adolph, *Thyristor Physics*, Springer–Verlag, 1976, pp. 147–150.

* cited by examiner

*Primary Examiner*—Stephen W. Jackson
(74) *Attorney, Agent, or Firm*—Chauza & Handley, L.L.P.

(57) ABSTRACT

An integrated circuit (40) providing overvoltage and overcurrent protection to a line (16). The integrated circuit (40) is constructed to provide overvoltage protection when a voltage exceeding a specified magnitude is impressed across the cathode and anode terminals (64, 66), irrespective of the gate-cathode current. A gate terminal (72) is provided to trigger the overvoltage protection device into conduction when a gate current exceeding a predefined value is carried on the line (16). The gate-cathode structure of the integrated circuit (40) includes a semiconductor resistance (74) which functions to make the gate current required for turn on higher, thereby allowing the gate-cathode terminals (64, 72) of the integrated circuit (40) too be connected in series with the line (16) to be protected.

70 Claims, 8 Drawing Sheets

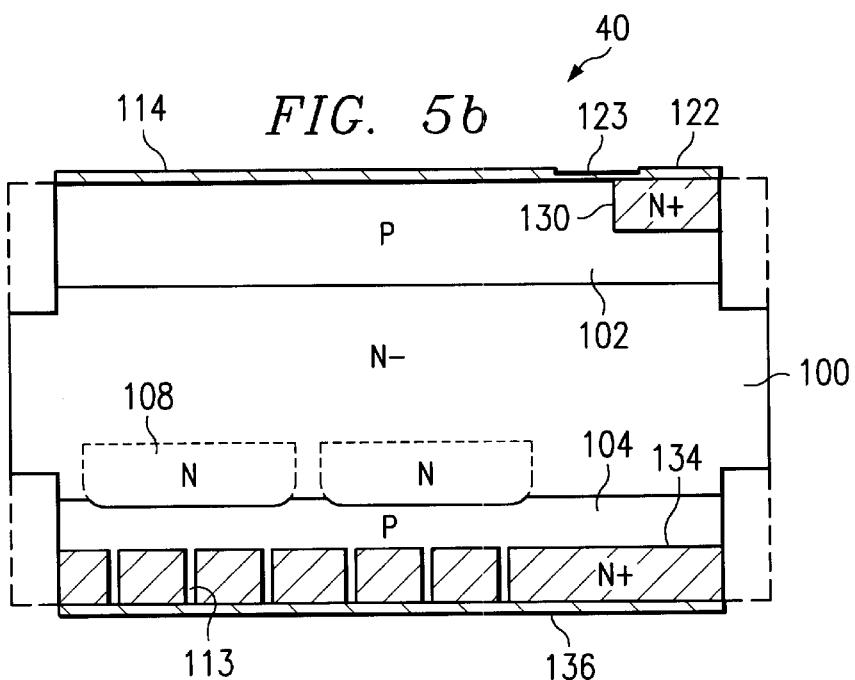
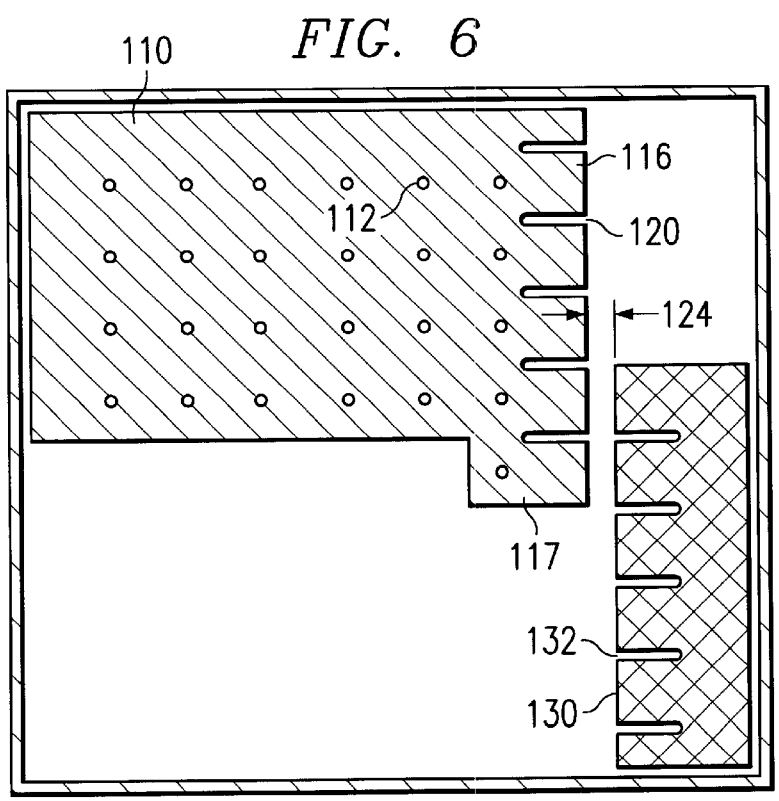

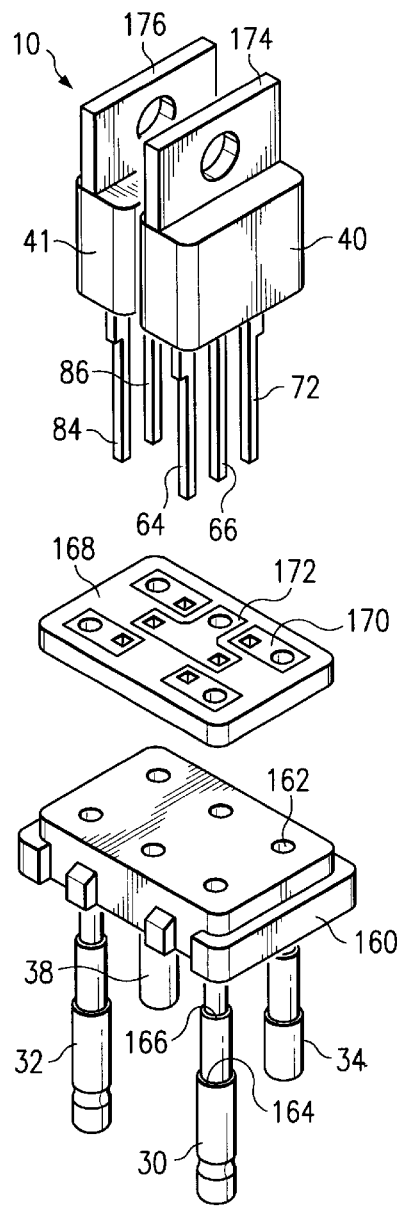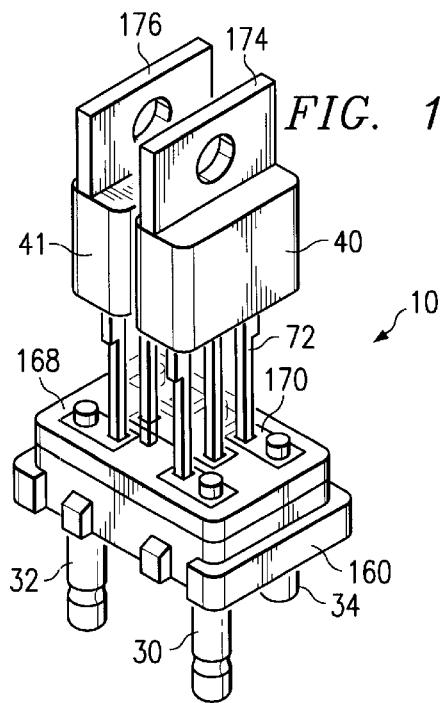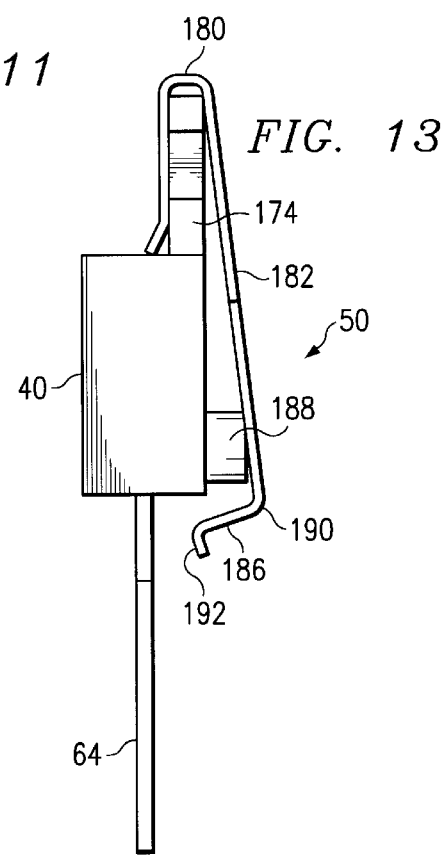
FIG. 11
FIG. 12
FIG. 13

SEMICONDUCTOR DEVICE PROVIDING OVERVOLTAGE AND OVERCURRENT PROTECTION FOR A LINE

This application claims benefit of Provisional application No. 60/130,070, filed Apr. 19, 1999.

TECHNICAL FIELD OF THE INVENTION

The present invention relates in general to circuits for protecting telephone lines and equipment from overvoltage and overcurrent conditions, and more particularly to an integrated circuit that accomplishes both such functions.

BACKGROUND OF THE INVENTION

Many telephone lines are situated so as to be subjected to external electrical interferences such as power line crosses, lightning strikes, electromagnetic fields, etc. Many different types of electrical circuits and apparatus have been designed to protect telephone lines from overvoltage and overcurrent conditions resulting from such disturbances. The applicable protection circuits are generally incorporated into line interface boards and other circuit modules that are utilized to terminate and otherwise interface the telephone lines to central office or subscriber circuits.

Twisted pair telephone lines typically carry up to 150 milliamp of loop current during normal operating conditions. Overcurrent conditions of a telephone line can be experienced when sneak currents in excess of the loop currents are coupled to the telephone lines. Sneak currents may constitute those currents which are not related to telephone signaling or information carried on the lines, but rather those stray AC and DC currents which contribute no useful information. Overcurrent conditions may also constitute those catastrophic currents carried as a result of lightning strikes or power line crosses.

As noted above, various types of apparatus have been devised for protecting the telephone lines and associated circuits from such overcurrent conditions. Mechanical heat coils are well known in the art for sensing overcurrent conditions. When an excessive current is carried by the telephone line, such current is carried through a heat coil which generates thermal energy sufficient to melt a soldered connection. Once the soldered connection melts, a spring loaded mechanism operates to thereby short circuit one or both conductors of the telephone line to ground. Many different types of heat coils are employed, but all such types of equipment rely on the melting point of solder, which is generally between 140–160° F. Many conventionally available heat coils are inappropriate for use in outdoor cabinets and other non-ventilated structures where the ambient temperature can rise above the melting point of the solder. When this occurs, the heat coils can be inadvertently activated due to the ambient heat alone. Once activated, the heat coils do not automatically reset, but must be manually replaced.

Overcurrent conditions can also be sensed by positive temperature coefficient (PTC) elements, often referred to as thermistors, placed in series with the telephone line. PTC elements are generally constructed of ceramic and other types of materials which increase in resistance as a function of the body temperature thereof which, in turn is a function of the current carried therethrough. Accordingly, as the telephone line current increases above an unsafe condition, the resistance of the PTC element increases, thereby restricting the flow of line current. In this instance, the telephone line is not shunted by the current limiting device, as is typical with heat coils, but rather the effective line resistance increases to prevent the subscriber equipment from being subjected to the overcurrent condition. An advantage of the use of PTC elements is that once the overcurrent condition is removed, the resistance of the device decreases to its steady state value, such as 8–10 ohms. The disadvantage with PTC elements is that they are expensive, bulky and difficult to scale down in size.

Yet another device employed to provide overcurrent protection to telephone lines are simple fuses. Series fuses in telephone lines are well known and readily used, but nevertheless are somewhat expensive due to the difficulty in manufacturing low-current fuses. Excessive currents in telephone lines may constitute 250 milliamps or more. The ability to accurately manufacture low amperage fuses is not easily carried out, thus the screening and manufacturing measures result in the increased cost of such fuses. Much like heat coils, once a fuse is blown, it must be replaced, and until replaced the telephone line cannot be used to carry information. Moreover, when heat is the mechanism that activates the protection device, it is generally slow reacting, thereby allowing an initial overcurrent to be passed to the circuits to be protected.

Overvoltage protection circuits are also well known in the field for protecting telephone lines from overvoltages, such as caused by lightning strikes and power line crosses. A host of solid state devices are readily available and, when placed in parallel with either the tip and ring conductors, or both, cause such lines to be either short circuited together, or short circuited to ground in response to the overvoltage condition. Various solid state overvoltage devices have been highly developed for providing precise overvoltage protection to telephone lines. Indeed, many different types of solid state overvoltage protection devices are available from Teccor Electronics, Irving, Tex., under the brand SIDACtor®. Such devices are characterized by a predefined breakover voltage, low initial voltage overshoot and a high current carrying capability. Many other thyristor, transistor and diode arrangements and combinations of devices, including gas discharge tube, carbon block air gaps have been utilized to provide overvoltage protection to telephone lines.

Telephone line protection modules and circuits generally require at least overvoltage protection capabilities. Yet other, more sophisticated protection applications require both overvoltage and overcurrent protection capabilities. However, the provision of both overvoltage and overcurrent protection generally involves the use of separate and distinct devices and circuits within the protection module to carry out the different functions. Stated another way, there is generally not available a single semiconductor device that provides both overcurrent and overvoltage capabilities.

From the foregoing, it can be seen that a need exists for a single device that provides both overcurrent and overvoltage protection capabilities. Yet another need exists for a semiconductor device that provides both overvoltage and overcurrent protection functions in a high speed manner, and is not destroyed once activated. Another need exists for a low cost device that provides both overvoltage and overcurrent protection capabilities, and which automatically resets so that replacement or manual resetting is not necessary. A need exists for a single low cost semiconductor device that provides both overcurrent and overvoltage protection without accompanying circuits or components.

SUMMARY OF THE INVENTION

In accordance with the principles and concepts of the present invention, there is provided a solid state protection device that overcomes and substantially reduces the shortcomings of the corresponding prior art circuits, modules and devices. In accordance with a preferred form of the invention, a single integrated circuit provides both overcurrent and overvoltage protection capabilities in the same chip. This not only simplifies the fabrication and assembly of electrical protection modules, but also reduces the cost thereof No solder melting techniques or moving parts are required to provide either the overcurrent or overvoltage protection capabilities. Moreover, the device according to the invention reacts in a high speed manner to both overvoltage and overcurrent conditions without being destroyed or otherwise having to be manually reset.

In accordance with the preferred embodiment of the invention, a bidirectional current carrying device, such as a specially designed triac, is utilized to provide overcurrent and overvoltage protection to the telephone line ring conductor circuits. In like manner, a specially designed triac is employed to provide overcurrent and overvoltage protection to the telephone line tip conductor circuits. Two-terminal SIDACtor® overvoltage devices produced by Teccor Electronics are formed in a single semiconductor chip, with multiple buried regions, shorting dots, and the like, to provide a precise breakover voltage in response to an overvoltage condition, to operate with only a small initial voltage overshoot, as well as provide a high current carrying capability. Such devices are described in U.S. Pat. No. 5,479,031 by Webb et al. However, rather than utilizing the standard two-terminal (anode/cathode) device, the present semiconductor device is fabricated to additionally provide a gate terminal that is externally accessible, much like a triac. When used in telephony applications, there is formed between the gate terminal and the cathode of the semiconductor device a resistance of less than about 20 ohms. This resistance is formed by appropriately doping the semiconductor material so that when a current of about 180–300 milliamp passes therethrough, a cathode-gate junction threshold voltage is reached, in which event the device is driven to its on-state condition. Hence, any telephone line overcurrent condition of about 180–300 milliamp causes the modified device to turn on, independent of any overvoltage condition. Two similar devices are formed in a single semiconductor chip to thereby provide both overcurrent and overvoltage protection to both telephone line conductors.

In the fabrication of the semiconductor devices according to the invention, an edge gate design is utilized. The semiconductor regions are formed with various geometries to accomplish balanced four quadrant operation.

Optionally, the telephone line protection device may not only include the single overcurrent and overvoltage chip, but may also utilize a mechanical failsafe switch to short circuit the tip and ring conductors to ground in case of a sustained overvoltage condition on the telephone line. This protects the semiconductor chip, as well as the subscriber circuits from sustained overvoltage conditions which might otherwise damage such equipment.

In one embodiment of the invention, there is included a semiconductor device providing overvoltage and overcurrent protection to a conductor, comprising a cathode, anode and gate terminal, a plurality of semiconductor regions of said device arranged to provide overvoltage protection to said conductor when an overvoltage is impressed between said cathode and anode terminals, irrespective of a magnitude of a gate-cathode current, and a plurality of semiconductor regions of said device arranged to provide overcurrent protection to said conductor when a current on the conductor exceeding a specified threshold passes through said gate and cathode terminals, and when said specified threshold is exceeded, the device is driven into a conduction state in which a magnitude of a cathode-anode voltage is low.

In another form of the invention, there is included a semiconductor device for use in protecting telephone line equipment from overvoltage and overcurrent conditions, comprising a first bidirectional current carrying device formed in a semiconductor material, said first bidirectional current carrying device including an anode, a cathode and a gate, and being responsive to an overvoltage of a specified magnitude between the anode and cathode for driving said first bidirectional device into a conduction state, a second bidirectional current carrying device formed in a semiconductor material, said second bidirectional current carrying device including an anode, a cathode and a gate, and operating substantially identical to said first bidirectional current carrying device, a first resistance formed in said semiconductor material across the gate and said cathode of said first bidirectional current carrying device, said first resistance being of a value selected for triggering said first bidirectional current carrying device when an overcurrent of a predefined value flows between a telephone line tip conductor and a customer equipment tip conductor, and a second resistance formed in said semiconductor material across the gate and said cathode of said second bidirectional current carrying device, said second resistance being of a value selected for triggering said second bidirectional current carrying device when an overcurrent of a predefined value flows between a telephone line ring conductor and a customer equipment ring conductor.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts or elements throughout the views, and in which:

FIGS. 4–6 constitute various layouts and a cross-sectional view of the semiconductor chip according to one embodiment of the invention;

FIGS. 11 and 12 illustrate respective exploded and assembled views of the solid state overcurrent and overvoltage line protection module according to one embodiment;

FIGS. 13 and 14 illustrate a failsafe device attached to the semiconductor devices shown in FIGS. 11 and 12.

DETAILED DESCRIPTION OF THE INVENTION

Figure 1:
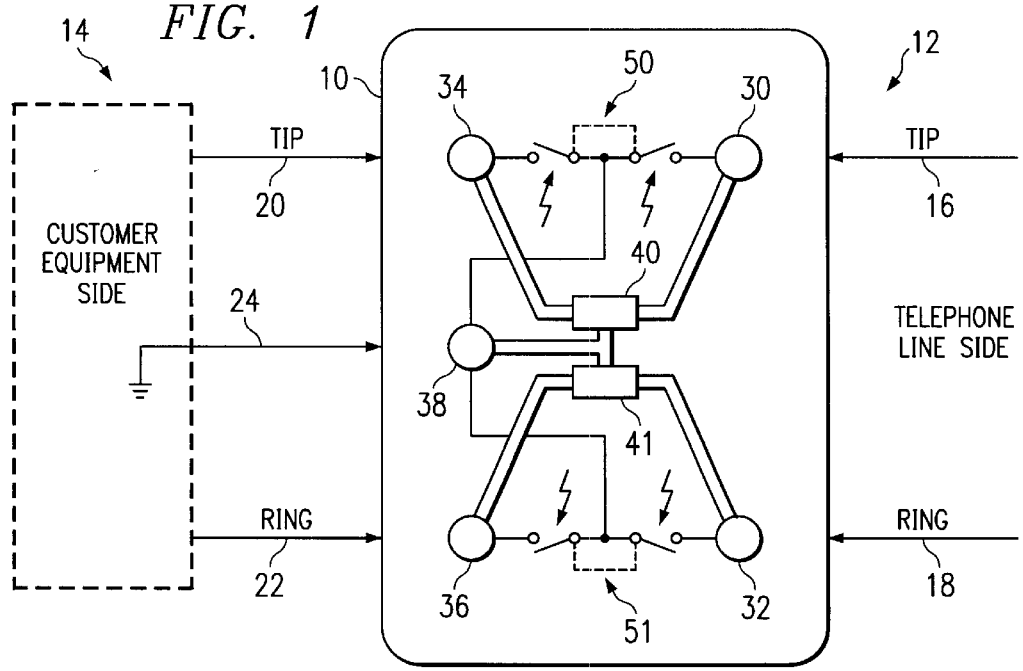
FIG. 1 diagrammatically illustrates a five-pin telephone line protection module having an integrated circuit chip providing overvoltage and overcurrent protection, as well as a mechanical switch mechanism providing protection against sustained overvoltage and overcurrent conditions.

While the invention can be utilized in a wide variety of applications, FIG. 1 illustrates a telephone line protection module 10 of the five-pin type, for interfacing a telephone line 12 to subscriber or customer side equipment 14. Telephone lines typically include a tip conductor 16 and a ring conductor 18 that are often installed in environments susceptible to lightning strikes, power line crosses, and the like. The customer side equipment 14 includes a corresponding customer tip conductor 20, a customer ring conductor 22, and a customer ground line 24. The customer side equipment 14 itself may include line cards, modems, interface circuits and a host of other types of apparatus typically utilized in conjunction with telephone lines.

The telephone line protection module 10 includes an elongate tip pin 30 and an elongate ring pin 32, both associated with the telephone line tip and ring conductors 16 and 18. A customer side tip pin 34 and ring pin 36 of the module 10 are shorter in length than corresponding pins 30 and 32. An elongate ground pin 38 is provided for connection to the common or ground circuit of the customer side equipment 14. Hence, and as is typical in practice, with the module 10 fully inserted into a socket (not shown), all five pins make connection to the corresponding conductors. However, when the module 10 is partially pulled out of the socket, only pins 30, 32 and 38 make contact to the corresponding circuits. In the partially removed condition, the module 10 still provides overvoltage protection to the telephone line tip and ring conductors 16 and 18, but the customer side tip and ring conductors 20 and 22 are open circuited.

Connected between pins 30, 34 and 38 of the module 10 is a first packaged integrated circuit 40. Connected between pins 32, 36 and 38 of the module 10 is a second integrated circuit 41. Integrated circuits 40 and 41 are substantially identical in electrical operation. As will be explained in more detail below, overcurrent protection is provided by the integrated circuit 40 between tip pins 30 and 34 to ground. In like manner, overcurrent protection is provided by the integrated circuit 41 between ring pins 32 and 36 to ground. Overvoltage protection is provided by the integrated circuits 40 and 41 between pins 30 and 32, which are connected to the respective telephone line tip and ring conductors 16 and 18, and between pins 34 and 36 which are connected to the respective customer side tip and ring conductors 20 and 22. Indeed, if an overvoltage condition exists on the tip conductor 16, then the integrated circuit package 40 provides a low-resistance path between telephone line tip pin 30 and ground pin 38. In like manner, if an overvoltage condition exists on the telephone ring conductor 18, a low-resistance path is provided by the integrated circuit package 41 between the telephone line ring pin 32 and the ground pin 38. Lastly, if a differential overvoltage exists between the telephone line tip conductor 16 and the ring conductor 18, then a low-resistance path is provided by the integrated circuits 40 and 41 between both tip and ring pins 30 and 32 to the ground pin 38. The integrated circuits 40 and 41 also provide overcurrent and overvoltage protection on customer side conductors 20 and 22, should the customer equipment generate any hazardous currents or voltages.

A mechanical heat sensitive switch mechanism 50 can be provided between the tip pins 30 and 34 and the common or circuit ground pin 38. When a sustained overcurrent exists either on the telephone line tip conductor 16 or the customer side tip conductor 20, or both, the heat sensitive switch mechanism 50 operates to provide a corresponding ground to all the respective pins. The other mechanical heat sensitive switch mechanism 51 is connected to the module pins to provide sustained overcurrent protection to the telephone line and customer ring conductors 18 and 22. Numerous failsafe switch mechanisms 50 and 51 are well known to those skilled in the art. Most failsafe switch mechanisms are not self resetting, but rather require manual resetting or replacement. The function of such mechanism is to sense the thermal energy generated by a sustained overvoltage or overcurrent and prevent catastrophic damage to either the protection circuits or the customer side equipment.

As can be appreciated from FIG. 1, the provision of the protection module 10 with integrated circuits 40 and 41 offers a simplified and inexpensive module that protects against both overvoltage and overcurrent conditions applied to any tip or ring pin of the module 10. As will be described below, each integrated circuit package 40 and 41 is constructed in the preferred embodiment as a semiconductor chip packaged in a TO-220 case. The respective heat sensitive switch is fastened directly to the package case to short circuit the pins thereof when the package case overheats in response to a sustained overcurrent.

Figure 2:
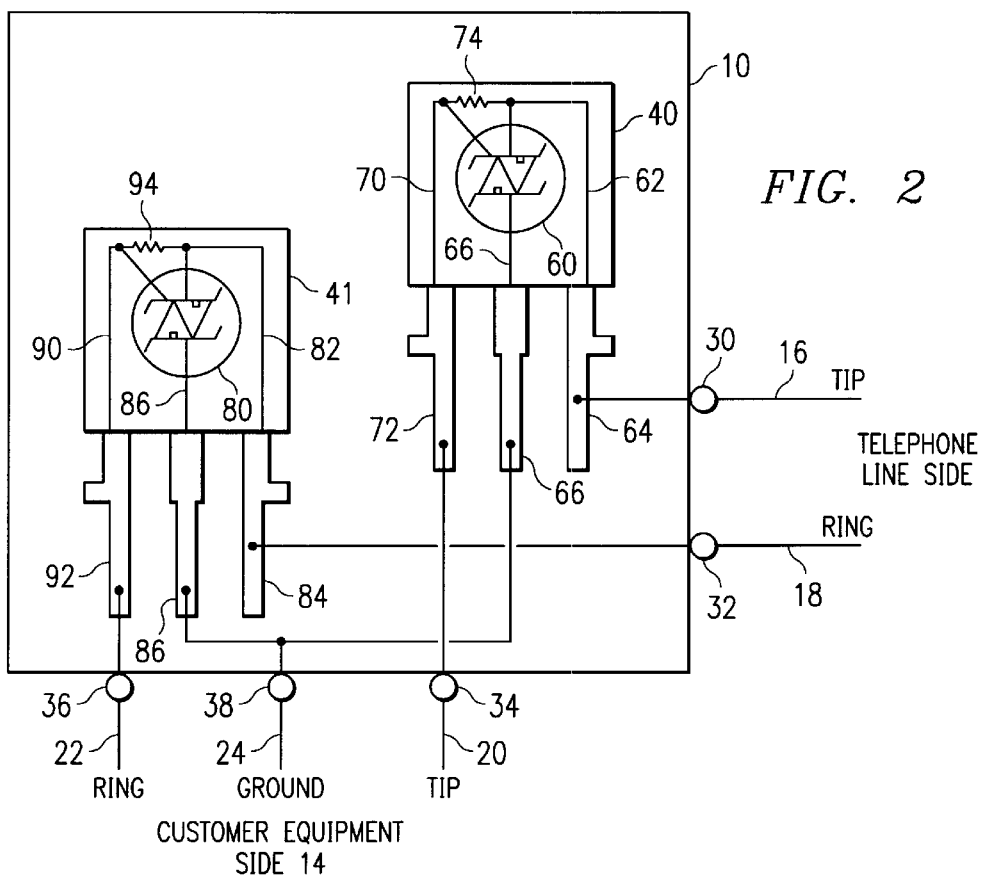
FIG. 2 schematically illustrates the construction of the semiconductor chip that employs in the preferred form of the invention, two specially-designed triac devices.

In reference to FIG. 2, there is schematically illustrated the electrical components of the overvoltage and overcurrent protection integrated circuits 40 and 41. For purposes of clarity, the heat sensitive switch mechanisms 50 and 51 are not shown. Each integrated circuit 40 and 41 is made from a silicon semiconductor material. The first packaged integrated circuit 40 is made using a first bidirectional current device 60 having a cathode 62 connected to a cathode pin 64. The cathode pin 64 is connected to the module telephone line tip pin 30. The anode 66 is connected to the module ground pin 38. A gate terminal 70 of the bidirectional current device 60 is connected to a customer side module pin 34 via a gate pin 72. Formed in the integrated circuit 40 between the telephone line module tip pin 30 and the customer side module tip pin 34 is a low-value shunt semiconductor resistance 74, typically between about 2 and 4 ohms. The value of the resistance 74 determines in part the threshold of overcurrent to which the bidirectional device 60 is responsive. For example, a resistance value of 2–4 ohms corresponds to an overcurrent threshold of about 300–350 milliamp to provide the requisite cathode-gate junction voltage to drive the bidirectional device 60 into a high current on state. Lower resistance values will require higher currents to turn on the device 60, and conversely higher resistance values will require lower tip conductor currents to drive the bidirectional device 60 into the on state. It is well known that any series resistance placed in the tip and ring circuits should be low so that the operation of the telephone lines is not compromised or otherwise degraded. In addition, any resistance placed in series with the telephone line tip conductor 16 should be balanced with the same value of resistance placed in series with the telephone line ring conductor 18. By making each shunt resistance 74 and 94 equal, the longitudinal balance of the telephone line is maintained. It is recognized that pairs of semiconductor resistors can be made with resistances that are very closely matched.

A second integrated circuit 41 formed as a second bidirectional current device 80 is associated with the telephone line ring conductor 18. The bidirectional device 80 includes a cathode 82 connected to a module pin 32 via a cathode pin 84. The module pin 32 is connected to the telephone line ring conductor 18. The bidirectional device 80 further includes an anode 86 connected to the module ground pin 38 via an anode pin 86. As shown in FIG. 2, the anode pin 66 of the first bidirectional device 60 is connected to the anode pin 86 of the second bidirectional device 80. A gate 90 of the second bidirectional device 80 is connected via a gate pin 92 to a module pin 36 associated with the customer side ring conductor 22. Connected between the cathode pin 84 and the gate pin 92 is a second shunt semiconductor resistance 94 that is substantially the same value as shunt resistance 74. The resistances 74 and 94 are formed by doping the semiconductor material with appropriate levels of impurities. As will be described more fully below, the resistances 74 and 94 are termed "shunt" resistances as they tend to shunt current in the semiconductor material away from the gate junctions to thereby decrease the gate sensitivity of the devices. The low gate-cathode resistance is generally undesirable in the fabrication of conventional triac devices, as the traditional aim is to make the devices more sensitive so as to be triggered by small gate currents.

Figure 3A:
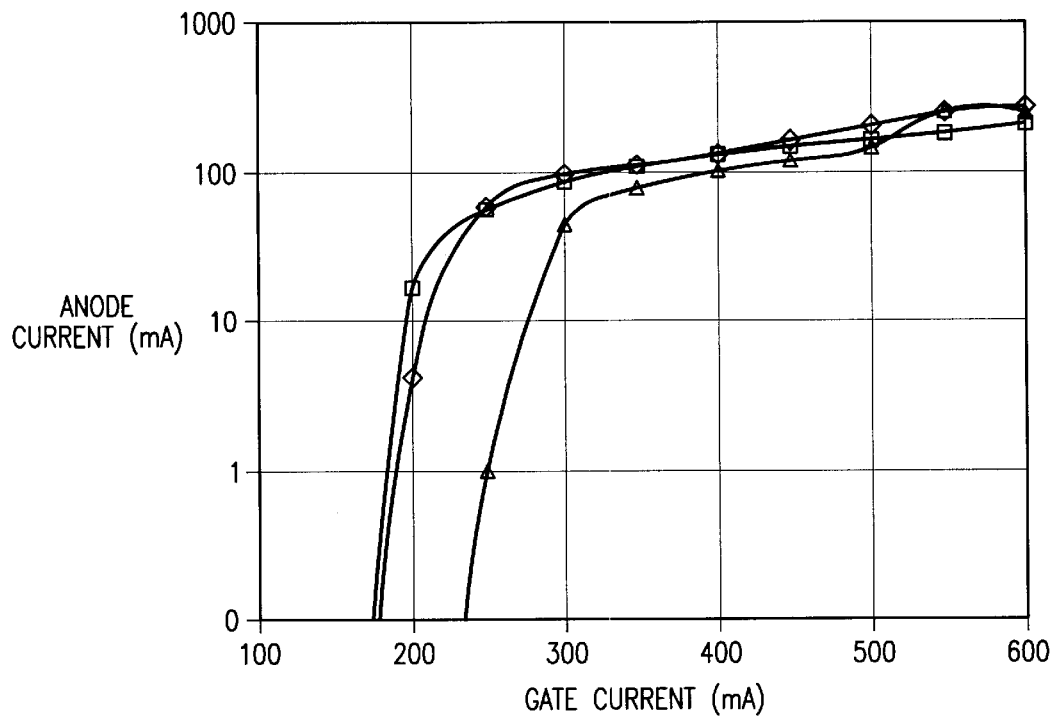
FIG. 3a graphically illustrates the first quadrant gate current/anode current switching characteristic of three such triac devices of the invention.
Figure 3B:
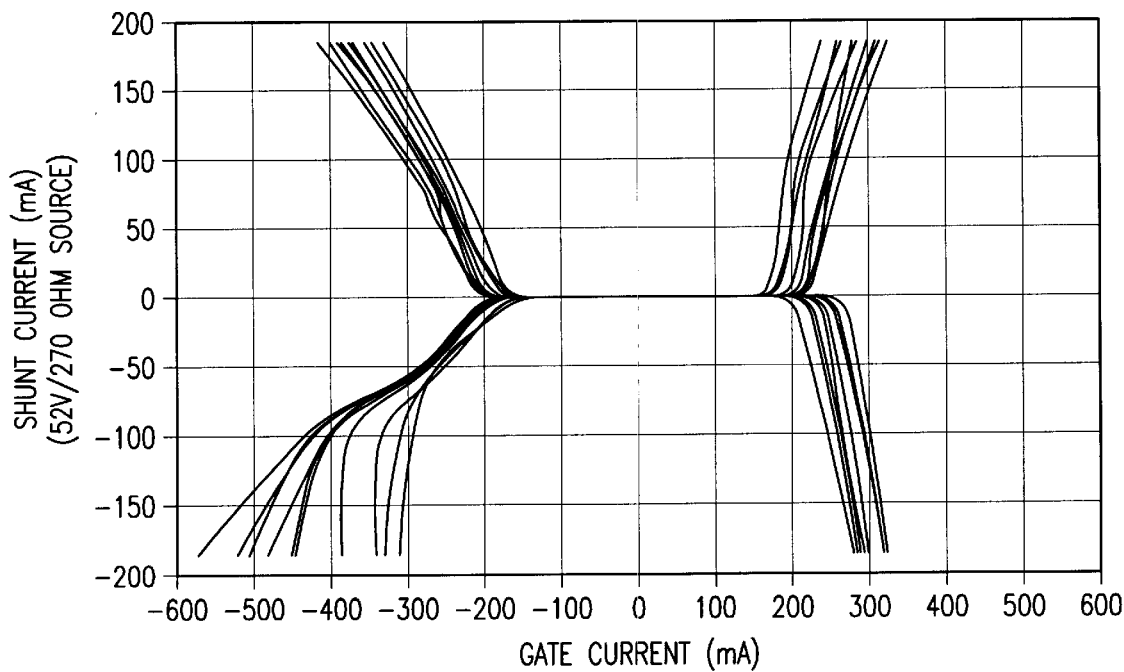
FIG. 3b illustrates the gate current versus the shunt current of a number of semiconductor devices constructed according to the invention.

The current characteristics of bidirectional current devices constructed according to the invention are shown in FIGS. 3a and 3b. The three waveforms of FIG. 3a illustrate the electrical characteristics of three different devices. The gate current of the bidirectional devices is shown on the horizontal axis of the graph, while the anode current is shown on the vertical axis. As can be seen, a gate current of between about 180 and 300 milliamp, which also corresponds to the telephone line current, flows through the gate-cathode circuit of the device 60 without reaching its turn-on threshold voltage. This high magnitude of gate current is unusual for turning on many conventional triac devices. It is noted that this gate current is not that current flowing through the anode of the bidirectional current devices 60 or 80, but rather is that current which flows through the shunt resistance 74 or 94 (FIG. 2).

In FIG. 3b, the bidirectional current thresholds are shown with respect to devices constructed according to the invention. As can be seen, gate currents which constitute informational signal currents between about 0–180 ma are transferred through the integrated circuits 40 and 41 without either protection device shunting any current to ground. Once the gate current exceeds about 180–300 ma, the gate-cathode threshold voltage (about 0.80 volt) is reached, whereby one or both of the devices begin to conduct and shunt all line currents to ground. It is noted that each device 60 and 80 is constructed to carry current in either direction as a result of either positive or negative gate bias voltages applied to the devices via the shunt resistances 74 and 94. As will be described below, the devices are constructed to exhibit balanced four quadrant operation.

In fabricating the integrated circuits 40 and 41, and in particular in the construction of each bidirectional device 60 and 80, conventional two-terminal SIDACtor® overvoltage device technology was initially utilized, but the processing steps were modified to achieve the functional overcurrent protection characteristics set forth below. A SIDACtor® overvoltage device is a two-terminal thyristor that is driven to a conductive state when a given breakover voltage is impressed across the anode and cathode terminals thereof First, it should be noted that standard triac devices are characterized by sensitive and small gate currents required for triggering thereof According to the present invention, a large gate current for turn-on of the thyristor device (on the order of 300 ma) is utilized for protecting telephone lines and circuits associated therewith. In order to reduce the sensitivity of the conventional triac, a number of shorting areas are formed on the surface of the semiconductor material to thereby shunt gate current away from the thyristor gate junction. In the invention, the number and resistance of the shorting areas 112 are selected to achieve a desired gate-cathode junction shunt resistance. In the preferred embodiment for use with telephone lines, the gate-cathode junction resistance is selected to be less than about 20 ohms, and preferably about 2–4 ohms. In other applications, the shunt resistance may be greater than 20 ohms, depending on the magnitude of the gate turn-on current desired.

With reference again to FIG. 2, when a current of about 300 milliamp is carried on the tip conductor 16, irrespective of the polarity thereof, the gate-cathode shunt resistance 74 will develop the requisite gate-cathode threshold voltage to trigger the bidirectional device 60, thereby effectively short circuiting the tip conductor 16 to ground via the ground line 24. Overcurrent protection is provided in the same manner by the other bidirectional device 80, with respect to the ring conductor 18 and the ground line 24. As noted above, if different overcurrent thresholds (other than 300 milliamp) are desired, then the effective shunt resistances 74 and 94 can be fabricated with different values. Nonetheless, the value of each shunt resistance 74 and 94 should remain matched to thereby maintain balanced telephone line operation.

The overvoltage protection function of the bidirectional device 60 is assured by fabricating the overvoltage-sensing thyristor according to the teachings of U.S. Pat. No. 5,479, 031. The full disclosure of this patent is incorporated herein by reference. According to this patent, a two-terminal overvoltage protection device is formed having plural buried regions made by deep ion implant techniques. The breakover voltage desired is a function of the impurity concentration of the buried regions. By varying the impurity level in the buried regions, breakover voltages in the range of about (60–350 volts) can be achieved. Importantly, overvoltage protection is provided by each bidirectional device 60 and 80, independent of the magnitude of the gate current. The anode/cathode structure of each bidirectional device 60 and 80 is responsive to an overvoltage which, when present on the telephone line, causes the device to enter an initial voltage breakover region. The initial voltage breakover is characterized by a small current flow through the bidirectional device 60, but where the anode-cathode voltage is not at a low value. When a sufficient anode-cathode current flows through the bidirectional device 60, i.e., after a switching current ($I_s$) threshold is reached, the voltage across the device switches to a low state, the current through the device increases and the device is considered as being in the full conductive on state. As also noted above, overvoltage protection to the telephone line conductors 16 and 18 can be provided even if the customer side tip conductor 20 and ring conductor 22 are removed or otherwise disconnected from the module 10. This can be achieved by partially removing the telephone line protection module 10 (FIG. 1) from its socket, thereby disconnecting module pins 34 and 36 from respective customer side conductors 20 and 22. As also noted above, the telephone line protection module pins 30, 32, and 38 are longer in length than the pins 34 and 36 associated with the customer side equipment. In operation, overcurrent protection can be provided in the following manner. If an overcurrent, such as for example 300 milliamp or more, is injected or otherwise imposed on the telephone line tip conductor 16, with a polarity causing the current to flow toward the integrated circuit 40 (pin 64), then such overcurrent will flow through the integrated circuit 40 and out of integrated circuit pin 72. A small magnitude of the overcurrent (about 300 ma) may momentarily flow through the customer side equipment 14 and out of the ring conductor 22, through the integrated circuit 80 (pins 92 and 84) and out of the module pin 32 to the telephone line ring conductor 18. Because the various components and shunt resistances of the devices 60 and 80 cannot generally be made absolutely identical, a race condition will exist as to which device 60 or 80 will turn on first. Assuming that the bidirectional device 60 turns on first, due perhaps to variations in device capacitances or the shunt resistance 74 being somewhat larger than shunt resistance 94, then the overcurrent will be shunted and flow from the telephone line tip conductor 16 through the device 60 to ground, via the customer side ground line 24. The bidirectional device 60 will remain in its on state for as long as the overcurrent condition exists. As such, the bidirectional device 60 shunts the overcurrent away from the customer side equipment 14, thereby protecting such equipment from overcurrent conditions. As noted above, in order for the bidirectional device 60 to be triggered into an on state, no overvoltage condition need exist, but rather only the requisite current must pass though shunt resistance 74 in order to exceed the gate/cathode junction voltage required for driving the device into the on state. Should the overcurrent condition remain for an extended period of time, the heat sensitive failsafe switch 50 may operate to provide a mechanical short circuit of both tip lines 16 and 20 to ground. This failsafe operation will prevent the circuit components of the bidirectional device 60 from overheating to the point of destruction.

If, in the example set forth above, the second bidirectional device 80 is driven into the on-state condition before the first bidirectional device 60, the following sequence of events occurs. An initial level of the overcurrent will flow from the telephone line tip conductor 16 through the first bidirectional device 60 and into the customer side equipment 14, via the customer side tip conductor 20. The initial current exceeding about 300 ma will flow out of the customer side equipment into the ring conductor 22, through the second bidirectional device 80 and out the telephone line ring conductor 18. In doing so, the initial overcurrent passes through the shunt resistance 94 of the second bidirectional device 80, thereby turning on the device and shunting the overcurrent to ground via the customer side ground line 24. This action effectively short circuits the overcurrent to ground through the second bidirectional device 80, rather than allowing such overcurrent to flow through the telephone line ring conductor 18.

When the second bidirectional device 80 turns on, the overall loop resistance is reduced, the effect of which is to increase the magnitude of the overcurrent. In doing so, the turn-on threshold of the first bidirectional device 60 will be reached, whereby such device 60 will also be driven into its on state. When the first bidirectional device 60 is driven into the on state, the excessive current on the telephone line tip conductor 16 is shunted to ground by such device, via the customer side ground line 24. This action reduces the current through the second bidirectional device 80 to the extent that the holding current of the second device 80 is not maintained and such device 80 returns to its off state. The first bidirectional device 60 remains in its on state as long as the excessive current is coupled to the telephone line tip conductor 16. Hence, in this latter condition, the customer side equipment 14 experiences the initial overcurrent for a very short period of time until it is extinguished by the first bidirectional device 60 being driven into its on state. The converse action occurs in connection with the foregoing, when an excessive or overcurrent condition of either polarity exists on the telephone line ring conductor 18. Overcurrent situations generated by the customer equipment 14 are shunted to ground by the bidirectional devices 60 and 80 in the same manner.

Each bidirectional device 60 and 80 is constructed such that its characteristic holding current is about the same as the switching current ($I_s$). Both the holding current and switching currents are a function of the value of the shunt resistances 74 and 94, and are selected to be greater than the information signal currents carried on the line to be protected. The information signal current is defined herein as those ac or dc currents that are intentionally imposed on the line and provide useful information to the users of the line. In the foregoing example, it is important that in the event the overcurrent condition is removed from the telephone line, the bidirectional devices 60 and 80 automatically reset to the off state so that the information signal currents can be carried on the line. To that end, when the overcurrent on the line is reduced (due to removal of the overcurrent source) and falls below about 300 ma, the bidirectional devices 60 and 80 no longer remain in the respective on states because the current carried by the devices is less than the holding current. As a result, the bidirectional devices 60 and 80 return to the off states and the telephone line is then able to carry information signal currents. This operation is in contrast to conventional triac devices when even typical information signal currents, and especially the telephone line dc current would maintain such devices in the on state until such ac and dc information signal currents are removed. The utilization of the bidirectional devices is therefore a significant advancement over the prior art devices commercially available.

The foregoing describes the application of the invention in the telephony field for protecting twisted pair subscriber loop lines. Many other applications may exist in which the overvoltage and overcurrent protection device may be utilized. Indeed, if only a single line is to be protected, then only a single device need be used. Other applications may not require the device to be of the bidirectional current carrying type.

Figure 4:
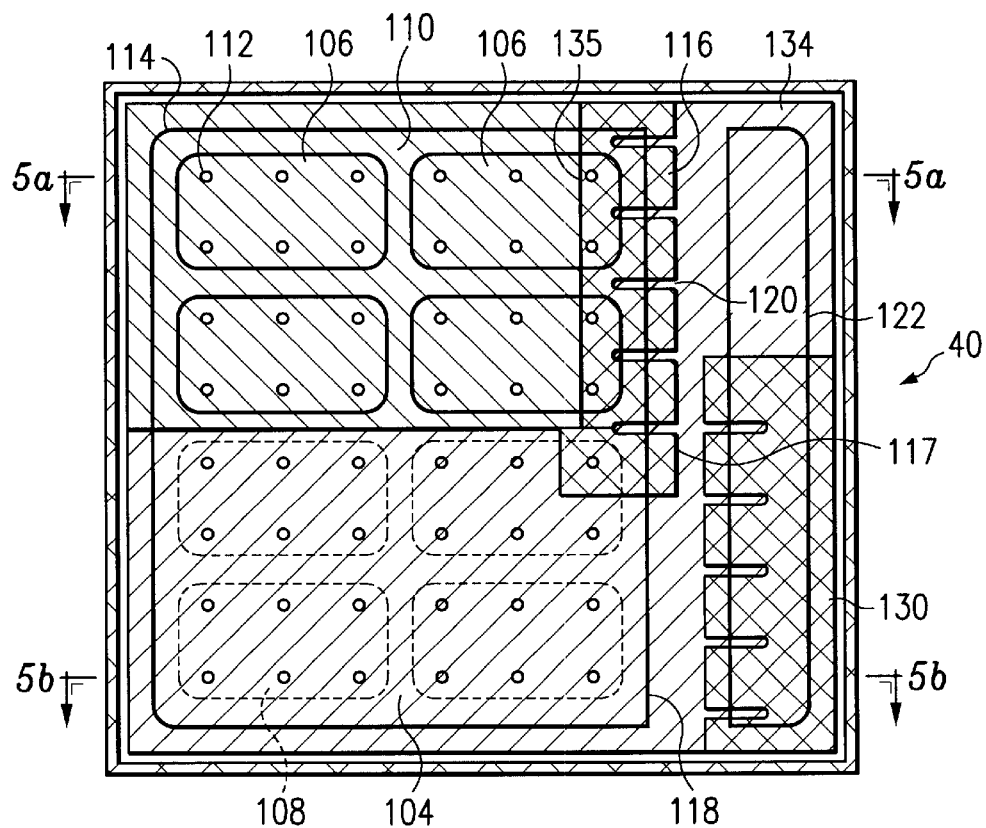
Figure 5A:
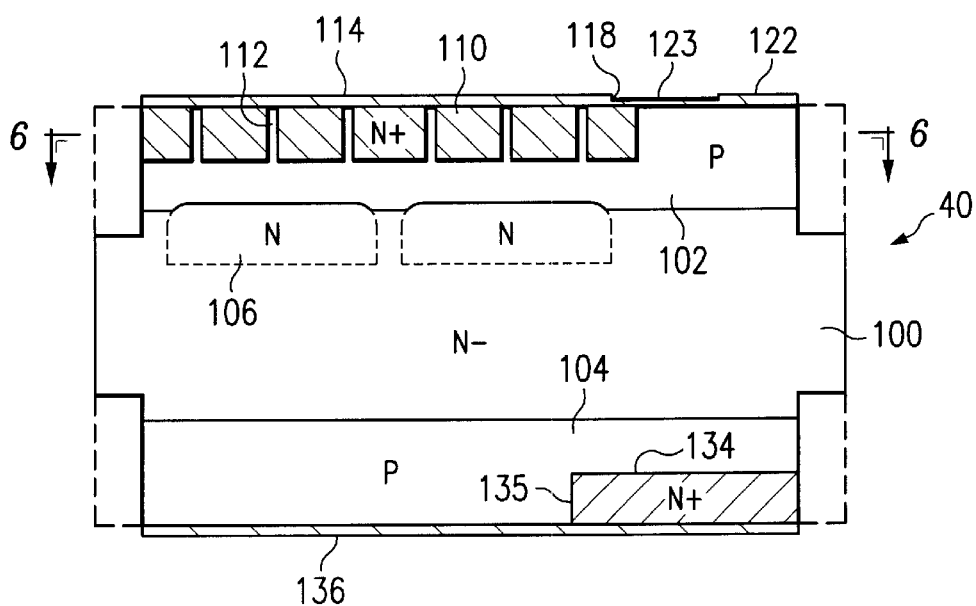

FIG. 4 is a top view of one line protection device constructed according to a first embodiment of the invention. FIG. 5a is a cross-sectional view of the integrated circuit 40 of FIG. 4, taken along line 5a–5a thereof. FIG. 5b is a cross-sectional view of the integrated circuit 40 of FIG. 4, taken along line 5b–5b thereof FIG. 6 is a top of view of the integrated circuit 40 shown in FIG. 5a, taken along line 6–6. The top views of FIGS. 4 and 6 show a first large top emitter 110 and a second smaller top emitter 130. The various other semiconductor regions are identified below. It should be noted that the device shown in FIGS. 4–6 corresponds to either integrated circuit 40 or 41 shown in FIG. 2.

The device, for example integrated circuit 40, is constructed with a lightly doped n-type silicon material, identified as mid-region 100 in FIGS. 5a and 5b. An upper p-type base region 102 is formed in the upper portion of the mid-region 100. The upper base 102 is fabricated with an appropriate doping level to achieve a sheet resistivity of about 20 ohm/square. A lower p-type base region 104 is similarly formed in the bottom part of the silicon material. A plurality of n-type buried regions, one shown as reference numeral 106, are formed in the wafer. The buried regions 106 are formed by ion implant techniques with a concentration level that is a function of the breakover voltage desired in the overvoltage protection portion of the device. Following the ion implant, the dopants are driven deeply into the wafer by a standard high temperature diffusion process. The first ion implant is carried out by driving n-type ions into the wafer from the top thereof. The p-type upper base 102, when formed, substantially overcomes the impurity type of the upper part of the n-type buried regions 106. FIG. 4 illustrates four buried regions 106 formed in the upper base 102. There are a corresponding number of buried regions 108 formed in the bottom base region 104, two of which are shown in FIG. 5b. In forming the lower buried regions 108, a second ion implant and extended diffusion are carried out to drive n-type ions into the wafer from the bottom thereof Because of the depth and concentration of the dopants implanted into the silicon wafer, the high temperature diffusion process may require up to ten days, or more, to complete.

As can be appreciated, the overvoltage-overcurrent protection device 60 of the invention is a bidirectional current carrying device that is operational in the four quadrants thereof The upper n+emitter 110 is formed in the upper base region 102, overlying the buried regions 106. The upper emitter 110 is shown in detail in FIGS. 4, 5a and 6. A second small upper emitter region 130 is shown in detail in FIGS. 4, 5b and 6. The geometry of these two emitter regions is effective in defining the electrical operation of the device in the various quadrants. The diagonal lines extending from the upper left to the lower right (FIGS. 4 and 6) identify both upper emitter regions 110 and 130. Formed within the upper emitter 110 are a plurality of shorting dots 112. In this embodiment of the invention, there are formed six shorting dots 112 in each portion of the emitter that overlies a respective buried region 106. A metal cathode contact 114 is formed over the upper emitter 110, over a major portion of the top surface of the device 60. The metal layer is shown by the heavy outline 114 in FIG. 4. Sometimes, the cathode contact is referred to in the art as main terminal one (MT1). A portion 116 of the upper emitter 110 extends laterally beyond an edge 118 of the metal cathode contact 114. The emitter portion 116 extending beyond the contact edge 118 is formed with a number of edge slots 120. The slots 120 have a width and length suitable for adjusting the shunt resistivity 74 to achieve a desired trigger level of gate current.

An edge gate metal contact 122 is rectangular in shape and formed on the top surface of the integrated circuit 40. The left edge of the edge gate contact 122 is spaced a predefined distance from the right edge 118 of the metal cathode contact 114. An electrical insulation 123, such as silicon oxide, separates the edges between the two contacts 114 and 122. The semiconductor regions underlying the cathode contact 114 generally relate to the function of the device 60 providing overvoltage protection, i.e., the primary function of a two-terminal SIDACtor® overvoltage device. The semiconductor regions underlying the gate contact 122, together with the other regions underlying the cathode contact 114, generally relate to the gating function to trigger the overvoltage protection portion of the device into conduction in response to an overcurrent condition.

During normal operation of the device, i.e., absent any overvoltage or overcurrent condition, telephone line current flows into the edge gate contact 122, through the upper base region 102 and to the metal cathode contact 114, via the shorting dots 112. Very little current, if any, flows through the upper n+ type emitter 110 at this time. As can be seen, the resistivity of the p-type upper base region 102, as well as the dimensions and geometry of the upper emitter region portion 110 function to define the magnitude of switching current carried through the device before triggering it to the on state. An extended corner portion 117 of the upper emitter 110 also functions to adjust the effective gate-cathode resistance 74. The corner portion 117 effectively varies or otherwise affects the path of the gate current before turn-on of the device 60. The further the emitter corner 117 extends downwardly in FIG. 4, the more the gate cathode resistance increases. The shunt resistance 74 is also a function of the spacing 124 between the edges of the upper emitter region portions 116 and 130 (FIG. 6). It is noted that it is the magnitude of lateral current flowing under the n+ type emitter 110 that initiates conduction. Once a sufficient amount of current flows in the upper base region 102, from the edge gate contact 122 to the cathode contact 114, a cathode-gate junction threshold voltage will be reached, in which event electrons will be injected from the emitter region 110 through the upper base region 102 into the mid-region 100, providing base current to the PnP transistor which in turn allows hole current to flow from the lower base 104 across mid-region 100 to the upper base 102 providing holes to the npn transistor. This regenerative process continues with the two transistors feeding each other until the voltage across the npnp SCR falls below a point that it is considered to be turned on. When this regenerative action occurs, current flows through the device 60 between the anode contact 136 and the cathode contact 114. This current flow occurs, of course, in one operational quadrant of the device. The smaller emitter region portion 130 also functions to provide balanced operation in the second and third quadrants when the gate current of the device 60 is negative. The slots 132 formed in the smaller emitter region portion 130 also function to control the gate sensitivity of the device 60.

A lower emitter 134 of the device 60 is shown in FIGS. 5a and 5b. The geometry of the lower emitter 134 is defined by the diagonal lines extending between the bottom left and top right of FIG. 4. Formed in the lower emitter below the respective buried regions 108 are a number of shorting dots 113. The shorting dots 113 and buried regions 108 function in the same manner as described above. A metal anode contact 136 (or main terminal two—MT2) is formed substantially over the entire bottom surface of the silicon chip 41. There is no gate contact on the bottom of the silicon chip, only on the top.

The four-quadrant operation of triacs in general is disclosed in detail in the textbook by Adolph Blicher entitled "Thyristor Physics," published by Springer-Verlag, 1976, the text and drawings of which are incorporated herein by reference. The four quadrant operation of a gated, bidirectional current carrying device arises because of four different operating conditions. In the first and second quadrants of operation, the anode is at a positive potential with regard to the cathode, and the gate is either biased with a positive voltage (first quadrant) or a negative voltage (second quadrant). In the third and fourth quadrants, the anode is maintained negative with respect to the cathode, and the gate is biased negatively (third quadrant) or with a positive voltage (fourth quadrant) with respect to the cathode.

With reference again to FIG. 4, and in respect to the first quadrant of operation, that portion of the metal gate contact 122 that does not overlie the smaller upper emitter 130 is effective to trigger the device 60 into a high-current on state. The gate metalization 122 that extends beyond the upper emitter region 130, when biased with a positive voltage, causes the large upper emitter region 110 to emit electrons. The electrons are emitted into the upper p-type base region 102, in the location between the right edge of the larger emitter region 110 and the left edge of the gate contact 122. When a sufficient number of electrons are injected through the upper base region 102 into the mid-region 100, the standard SCR operation is initiated, whereupon conduction of the device 60 begins. When turned on, current flows through the device 60 from anode contact 136 to cathode contact 114. It can be seen that the geometry of the right edge of the large upper emitter 110 (the slotted configuration) as well as the spacing from the left edge of the metal gate contact 122, determines in part the magnitude of gate current which causes the device 60 to be driven into conduction.

The magnitude of the gate current necessary to drive the device 60 into conduction in the first quadrant can also be adjusted by utilizing a base region 102 with different thicknesses. With a thinner upper base region 102, the lateral gate current needed to drive the device 60 into conduction will be reduced. This is because with a thinner upper base region 102, the resistivity thereof will be increased, thereby decreasing the lateral current necessary to achieve the required gate-cathode junction voltage to turn on the device 60. The upper base 102 can be made with a desired thickness by adjusting the depth by which the upper emitter 110 is formed in the upper base 102.

As noted above, the use of shorting dots 112 in the upper emitter 110 shunts lateral current flowing under the emitter 110, thereby increasing the magnitude of current needed to drive the device 60 into conduction. Thus, using additional or larger-diameter shorting dots 112 increases the gate current for device turn on. Moreover, by locating the shorting dots 112 closer to the origin of the lateral current flow, the gate current necessary for device turn on is also increased. This latter design geometry of the emitter, as well as the geometry of the edge slots 120, can be varied to achieve a match between the switching current and holding current of the device 60.

In the second quadrant of operation, the metal gate contact 122 is biased with a negative voltage. Because the cathode contact 114 is biased with a more positive voltage, the junction between the upper p-type base 102 and the smaller emitter region 130 is forward biased. As such, the smaller emitter region 130 injects electrons into the upper p-type base region 102, thereby triggering the device 60 into the conduction state according to standard SCR operation, in which current flows from the anode contact 136 to the cathode contact 114. Since the gate current is negative in the second quadrant, lateral current flows in the opposite direction in the upper base region 102. It can be seen that the device geometry, i.e., the slotted configuration of the small, upper emitter region 130, together with its spacing from the edge of the metal cathode contact 114, determines in a large part the magnitude of current necessary to trigger the device into its conduction state. The doping level of the p-type upper base region 102 also plays a part in determining the resistivity of the silicon material and the gate current necessary to drive the device 60 into conduction.

In the third quadrant of operation, the various semiconductor regions operate as a remote gate, as is well known in the art. In other words, since gate current exiting the gate contact 122 does not generate the injected electrons necessary to drive the device into conduction, such electrons must come from another source. In the third quadrant, the cathode terminal 114 is positive with respect to the anode terminal 136. As such, the gate junction between semiconductor regions 130 and 102 is forward biased. The small, upper emitter 130 injects electrons into the upper p-type base 102. The electrons are collected and proceed into the mid-region 100, which make such region more negative with respect to the upper base region 102. The junction between the mid region 100 and the p-type upper base 102 becomes more forward biased and begins injecting holes into the mid region 100 and the lower base-region 104. The npn semiconductor regions 130, 102 and 100 form a transistor defining the remote gate, which facilitates driving into conduction the regions forming the pnpn device. The magnitude of the negative gate current necessary for third quadrant operation is a function of the location of the small upper emitter 130 and the lower emitter 134. The extent by which the lower emitter region 134 underlies the small upper emitter region 130 determines the gate current for device turn on. In addition, the vertical distance between the emitter regions 130 and 134 functions to also define the turn-on gate current. These geometrical features relate to the bulk semiconductor resistivity between the two emitter regions 130 and 134. With a greater distance between the two emitter regions 130 and 134, either laterally or vertically, the resistance therebetween increases. With increased distance and resistance, the chances that the mobile carriers recombine increases, thereby increasing the current necessary to turn on the device 60.

In the fourth quadrant of operation, the anode contact 136 is negative with regard to the cathode contact 114, and the gate contact 122 is biased positively with respect to the cathode contact 114. With this situation, the pn junction between the upper base 102 and the large emitter 110 is forward biased, whereby the large emitter 110 injects electrons into the upper p-type base 102. These injected electrons are swept into the lightly doped mid-region 100. Various electrical interactions occurring between the junctions are well known in the art according to conventional triac operation, whereupon the junction between the lower emitter 134 and the lower base 104 becomes forward biased. The pnpn junctions of the triac in this mode of operation are turned on into full conduction, whereby large currents are allowed to flow from the cathode terminal 114 to the anode terminal 136. This mode of operation is commonly referred to as remote gating of the device 60.

The extent by which the left edge of the lower emitter 134 (FIG. 5*a*) extends under the upper large emitter 110 determines the gate trigger current in the fourth quadrant. The left edge of the emitter 134 is shown as heavy line 135 in FIG. 4. As the left edge 135 of the lower emitter 134 is moved to the right, the portion of the lower emitter 134 that underlies the upper emitter 110 is reduced. As a result, the gate current needed to turn on the device for fourth quadrant operation is increased.

The foregoing operation of the semiconductor device 60 illustrates the bidirectional current carrying capabilities in the various quadrants. A single such device 60 can be utilized to provide overvoltage and overcurrent protection to any type of line, such as a telephone line conductor. When employed to protect a telephone line twisted pair, two such devices can be utilized to protect the pair of lines from overvoltage and overcurrent conditions. Ideally, it is desired that the operational characteristics of both devices be very similar so that balanced four quadrant operation is achieved. In practice, the devices are constructed with semiconductor features and geometries so as to be able to conduct 150 amp surge currents and 10 amp sustained currents.

Figure 7:
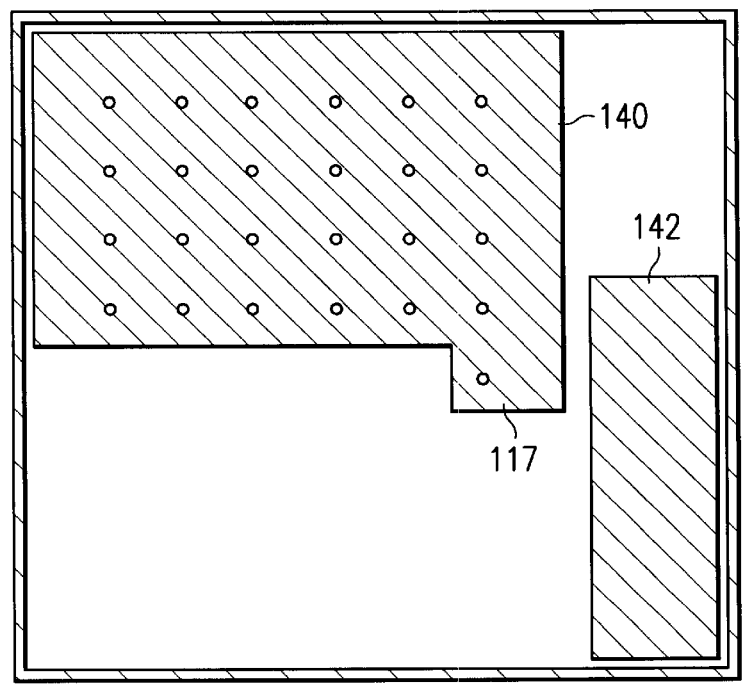
FIGS. 7 and 8 are layout views of another embodiment.
Figure 8:
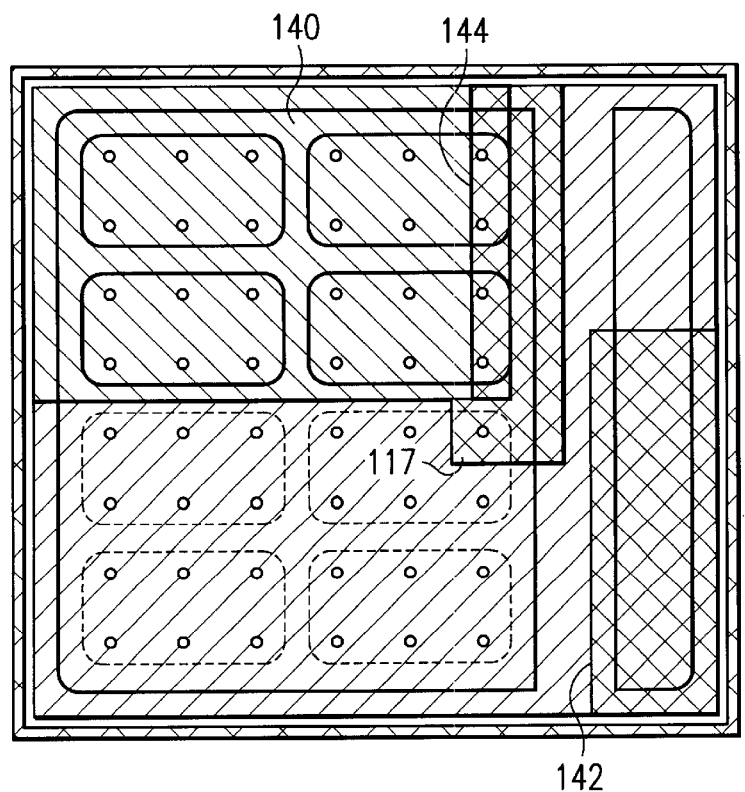

FIGS. 7 and 8 illustrate another embodiment of the invention, in which the upper emitter regions 140 and 142 are formed without the edge slots 120 and 132 shown in FIGS. 4 and 6. In this instance, the starting silicon wafer is intrinsically doped to achieve a sheet resistance of about 10 ohm/square. The upper emitter 140 is formed with the corner portion 117, much like that shown in FIG. 6. With this emitter geometry, yet other reduced gate current sensitivities are achieved. The rectangular heavy line 144 illustrates the lateral variation in which the upper large emitter 140 and the lower emitter portion 134 (FIG. 5*a*) can overlap to achieve different sensitivities in the fourth quadrant.

Figure 9:
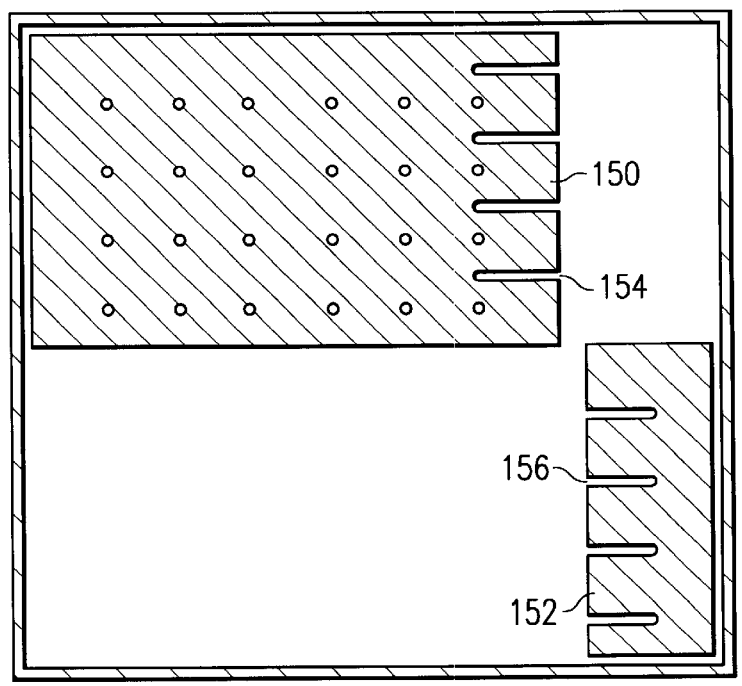
FIGS. 9 and 10 are layout views of yet another embodiment of the invention.
Figure 10:
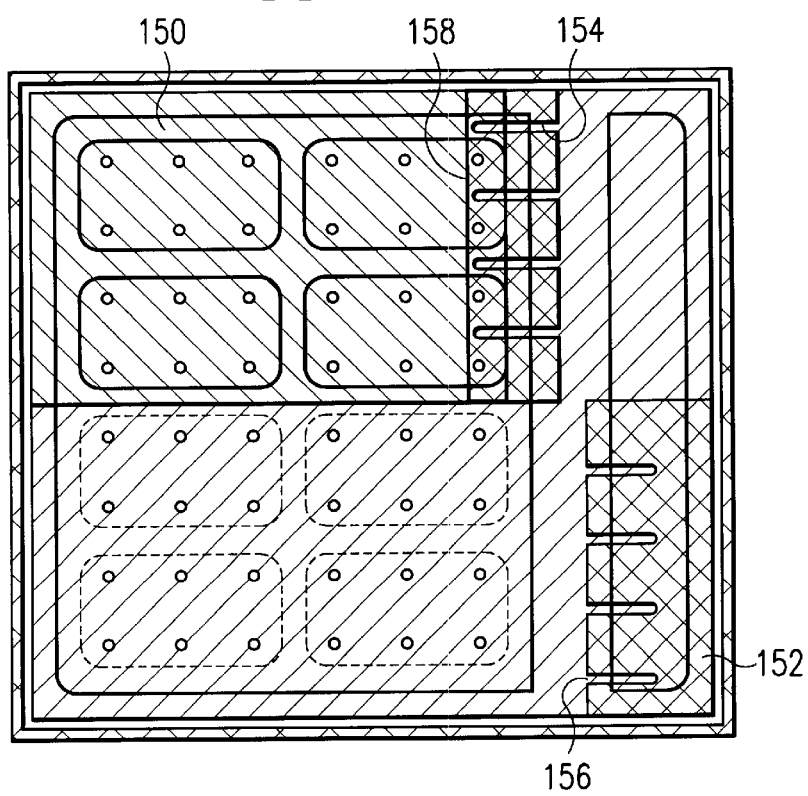

FIGS. 9 and 10 illustrate another embodiment of an emitter configuration of a device according to the invention. The emitter regions 150 and 152 include respective slots 154 and 156 much like the emitter geometry shown in FIG. 6. However, the large emitter region 150 does not include the corner portion 117 shown in FIG. 7. This top emitter geometry affects the first quadrant gate trigger current, in that a larger gate current will be required in order for the device to reach its breakover voltage. FIG. 10 illustrates the various metal contacts and buried regions superimposed on the drawing of FIG. 9. The heavy line 158 shows the upper emitter 150 overlap with regard to the lower emitter portion 134 (FIG. 5a).

Various other emitter configurations can be utilized to provide a further and/or different adjustments of the shunt resistance, as well as the operation of the device in the various quadrants thereof Moreover, those skilled in the art may prefer to form two devices 60 and 80 in the same chip, and such a configuration will be facilitated in view of the foregoing description.

FIGS. 11 and 12 illustrate the line protection module 10 as utilized in the preferred embodiment for protecting telephone lines. For purposes of clarity, the protective cover snap locked to the module is not shown. The module 10 includes a plastic molded base 160 having a number of holes 162 therethrough for insertion of respective module pins 30–38. The telephone line pins 30 and 32 as well as the ground pin 38 are longer than the corresponding customer side pins 34 and 36. The module pins 30–38 each have a first shoulder 164 that prevents insertion thereof completely through the base 160. A second shoulder 166 abuts against the bottom surface of a printed circuit board 168. The printed circuit board 168 includes a number of conductive paths that provide connections between the various module pins of the base 160, and the pins of the integrated circuits 40 and 41. The top ends of each of the module pins 30–38 are swaged or otherwise soldered to the respective conductive paths 170. As can be seen from FIG. 11, the conductive path 172 is connected to the ground pin 38 of the module 10, as well as to the respective anode pins 66 and 86 of the integrated circuits 40 and 41. Additionally, the heat sink tabs 174 and 176 of the integrated circuits 40 and 41 are connected internally to the respective anode pins 66 and 86. Hence, the heat sink tabs 174 and 176 are connected to the module ground pin 38.

Once the top ends of the module pins 30–38 are electrically fixed to the corresponding conductive paths of the printed circuit board 168, the pins of the integrated circuits 40 and 41 are inserted into the respective plated-through holes of the printed circuit board 168. The integrated circuit pins are then soldered to the corresponding conductive paths. The protection module 10 shown in FIG. 12 is then effective to provide overcurrent and overvoltage protection to a pair of conductors, all by utilizing only two integrated circuits, and no other external discrete components. It can be seen that this overvoltage and overcurrent protection module is extremely simplified in terms of component count, cost, and longevity, in view of protection modules known in the prior art.

Figure 14:
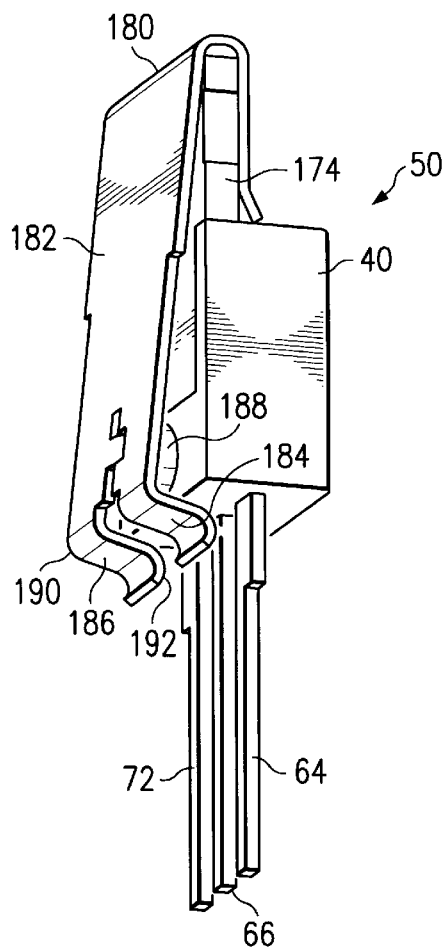

In the event that failsafe operation is desired, the mechanical heat sensitive switch mechanism 50 shown in FIGS. 13 and 14 can be utilized in conjunction with the integrated circuits 40 and 41. The heat sensitive switch 50 includes a single formed piece of a thermally and electrically conductive material such as tin-plated beryllium copper. The heat sensitive switch 50 includes a U-shaped end 180 that can be firmly clamped to the heat sink tab 174 of the integrated circuit 40. The mechanical connection between the U-shaped end 180 and the heat sink tab 174 provides a suitable mechanism for the transfer of heat from the heat sink tab 174 to the heat sensitive switch 50. The heat sensitive switch 50 further includes a downwardly depending portion 182 that terminates in a pair of spaced-apart shorting legs 184 and 186. A solder pellet 188 is inserted between the backside of the integrated circuit 40 and the downwardly depending portion 182 of the heat sensitive switch 50. The solder pellet 188 is cylindrical in shape, with flat opposing ends thereof for abutting against the integrated circuit 40 and the heat sensitive switch portion 182. In order to insert the solder pellet 188 into its position shown in FIG. 13, the downwardly depending portion 182 of the heat sensitive switch 50 is pried away from the backside of the integrated circuit 40. Then, the solder pellet 188 is inserted therebetween and the downwardly depending portion 182 is released and allowed to mechanically clamp the solder pellet 188 in place. It should be noted that in the forming of the heat sensitive switch 50, the shorting legs 184 and 186 are made so that when the solder pellet 188 melts, the shorting legs become spring biased against the respective integrated circuit pins 64 and 72.

A bend 190 in the switch 50 where the legs 184 and 186 join with the downwardly depending member 182, prevents the solder pellet 188 from falling downwardly and becoming disengaged between the package of the integrated circuit 40 and the heat sensitive switch 50. As noted in FIG. 13, when the solder pellet 188 is intact, the respective ends 192 of the shorting legs 184 and 186 are spaced apart from the pins 64 and 72 of the integrated circuit 40. However, should a sustained overcurrent condition exist on the line to be protected, the integrated circuit 40 will generate a substantial amount of thermal energy. The thermal energy is transferred from the heat sink tab 174 to the heat sensitive switch 50. The solder pellet 188 being fixed between these two items, can reach a temperature (183° C.) such that it melts. When this happens, the downwardly depending portion 182 of the heat sensitive switch 50 returns to its relaxed position, where the ends 192 of the respective shorting arms 184 and 186 become spring biased against the respective integrated circuit pins 72 and 64. Because the heat sink tab 174 of the integrated circuit 40 is connected to ground through the module pin 38, the electrically conductive heat sensitive switch 50 effectively short circuits the integrated circuit pins 64 and 72 to ground. This mechanical short circuit provides a failsafe mechanism to maintain each end of the line coupled to the integrated circuit at a ground potential for as long as the overcurrent condition exists. When used for protecting telephone lines, the operation of the heat sensitive switch 50 provides a ground potential to the telephone line tip conductor 16 as well as to the customer side tip conductor 20. A heat sensitive switch 51 of the same construction is preferably fastened to the heat sink tab 176 of the other integrated circuit 41 to provide corresponding failsafe protection to a telephone line ring conductor 18 and to a customer equipment ring conductor 22. The failsafe mechanism can operate in response to a sustained overcurrent condition generated on either, or both sides of the protection module 00.

Figure 15:
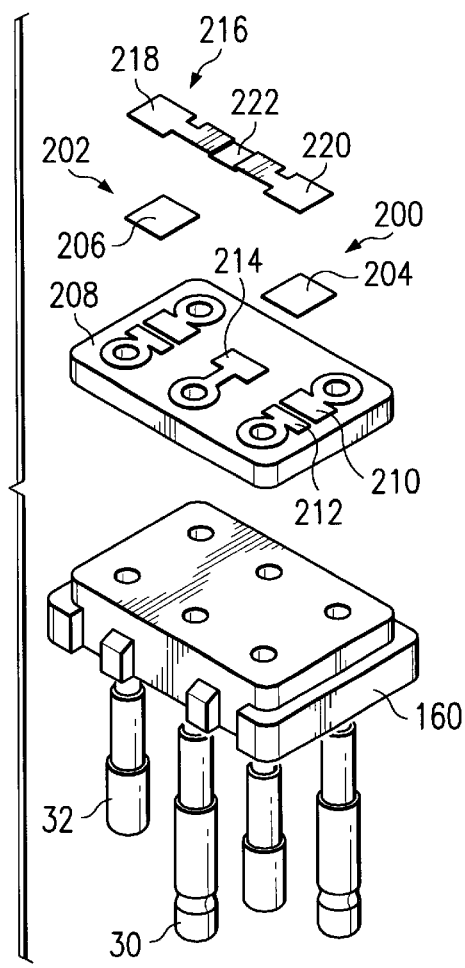
FIGS. 15 and 16 illustrate respective exploded and assembled views of a solid state overcurrent and overvoltage line protection module according to another embodiment.
Figure 16:
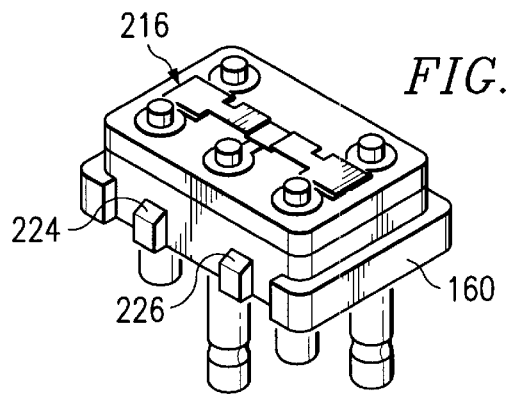

FIGS. 15 and 16 illustrate yet another embodiment of the protection module according to the invention. Here, unpackaged integrated circuits 200 and 202 are utilized. The top surface contact 204 and 206 constitute the anode of the devices, while the bottom side of the integrated circuits 200 and 202 have respective cathode and gate contacts. The cathode contact on the top surface of the printed circuit board 208 is shown as reference numeral 210, while the gate contact is shown as reference numeral 212. Printed wire paths either internal to the printed circuit board 208, or formed on the top or bottom side thereof, are effective to connect the respective tip and ring module pins to the gate and cathode conductive paths in a manner shown in FIG. 2. Another conductive path 214 is formed on the printed circuit board 208 for connecting to the module ground pin 38.

When the integrated circuits 200 and 202 are either spring biased or fixed such as by soldering to the respective conductive paths 210 and 212, the gate and cathode terminals thereof are electrically connected to the corresponding customer side and telephone line side of the module. A conductive bridge 216 has end pads 218 and 220 that are soldered or otherwise fixed to the anode contacts 204 and 206 of the integrated circuits 200 and 202. A middle portion 222 of the bridge 216 is soldered to the ground conductive path 214 of the printed circuit board 208. The anode contacts 204 and 206 of the integrated circuits 200 and 202 are thus effectively grounded to the ground pin 38. The completed overvoltage and overcurrent protection module is shown in FIG. 16, without a protective cover thereon. The protective cover of the modules disclosed herein is of a conventional type that is snap fit to the corresponding side ears 224 and 226 molded on opposing sides of the base 160. In the embodiment shown in FIGS. 15 and 16, there is no mechanical heat sensitive failsafe mechanism to protect against sustained overcurrent conditions on the lines to be protected.

The foregoing description describes the fabrication of the bidirectional device utilizing a multiple buried region process. The principles and concepts of the invention can be exploited by those skilled in the art by employing other techniques, such as by utilizing a single buried region rather than multiple buried regions, or no buried region at all and instead selecting a starting silicon material that is intrinsically doped to achieve the desired breakover voltage threshold, or combinations of the foregoing. Planar devices can also be utilized with appropriate surface doping levels to achieve the desired breakover voltage threshold. Punch-through device technology can be used to make devices programmed to achieve the desired breakover voltage threshold. Multiple diffusions can be utilized to adjust the breakover voltage threshold. P-type or .n-type starting silicon wafers can be employed. Various and different combinations of SCR pairs can be utilized instead of triacs. The invention can also be made by utilization of the MOS, insulated gate bipolar transistor, JFET, and other processing technologies that are now or will be suitable in the future.

While the preferred and other embodiments of the invention have been disclosed with reference to specific circuit and semiconductor structures, it is to be understood that many changes in detail may be made as a matter of engineering choices without departing from the spirit and scope of the invention, as defined by the appended claims.

What is claimed is:

1. An integrated semiconductor device providing overvoltage and overcurrent protection to a conductor, said semiconductor device comprising:
    a cathode, anode and gate terminal;
    a plurality of semiconductor regions of said device arranged to provide overvoltage protection to said conductor when an overvoltage is impressed between said cathode and anode terminals;
    a resistor formed of semiconductor material between said gate terminal and said cathode terminal; and
    a plurality of semiconductor regions of said device arranged to provide overcurrent protection to said conductor when a current on the conductor exceeding a specified threshold passes through said resistor of semiconductor material, and when said specified threshold is exceeded, the device is driven into a conduction state in which a magnitude of a cathode-anode voltage is low.

2. The integrated semiconductor device of claim 1, wherein a magnitude of said cathode-anode voltage is less than about three volts.

3. The integrated semiconductor device of claim 1, further including in combination said conductor, and wherein the gate and cathode terminals of said device are connected in series with said conductor so that the magnitude of current flowing in said conductor flows into one of said cathode terminator said gate terminal of said semiconductor device.

4. The integrated semiconductor device of claim 3, wherein the anode terminal of said device is connected to a circuit common.

5. The integrated semiconductor device of claim 1, wherein said resistor is in series with said conductor to limit current in said conductor when said device is in an off state, and to drive said device into an on state in response to a current exceeding said specified threshold passing through said resistor.

6. The integrated semiconductor device of claim 5, wherein said resistor is less than about 20 ohm.

7. The integrated semiconductor device of claim 1, wherein said semiconductor device is triggered into an on state in response to a gate-cathode current exceeding about 180 ma.

8. The integrated semiconductor device of claim 1, wherein said semiconductor device is operational to provide overcurrent protection to said conductor in all four operational quadrants.

9. The integrated semiconductor device of claim 8, wherein a gate-cathode current for turning on the semiconductor device is about the same magnitude in all four operational quadrants.

10. The integrated semiconductor device of claim 1, wherein said device is coupled in a telephone line conductor to provide overcurrent and overvoltage protection thereto.

11. The integrated semiconductor device of claim 1, wherein said device is constructed to have a specified holding current of a magnitude substantially the same as a switching current of said device.

12. The integrated semiconductor device of claim 11, wherein said holding current is greater than ac and dc information signal currents carried on said conductor.

13. The integrated semiconductor device of claim 12, wherein said conductor comprises a telephone line supplied with dc line currents, and wherein the holding current of said semiconductor device is greater than the dc line currents of the telephone line.

14. The integrated semiconductor device of claim 1, wherein said device is packaged as a three-terminal device providing overcurrent and overvoltage protection functions.

15. An integrated semiconductor module for use in protecting telephone line equipment from overvoltage and overcurrent conditions, comprising;
    a first bidirectional current carrying device formed in a semiconductor material, said first bidirectional current carrying device including an anode, a cathode and a gate, and being responsive to an overvoltage of a specified magnitude between the anode and cathode for driving said first bidirectional device into a conduction state; and
    a first resistor formed in said semiconductor material and connected to said gate and said cathode of said first bidirectional current carrying device, said first resistor being of a value selected for triggering said first bidirectional current carrying device when an overcurrent of a predefined value flows between a telephone line tip conductor and a customer equipment tip conductor.

16. The integrated semiconductor module of claim 15, further including:
   a second bidirectional current carrying device formed in a semiconductor material, said second bidirectional current carrying device including an anode, a cathode and a gate, and operating substantially identical to said first bidirectional current carrying device; and
   a second resistor formed in said semiconductor material and connected to said gate and said cathode of said second bidirectional current carrying device, said second resistor being of a value selected for triggering said second bidirectional current carrying device when an overcurrent of a predefined value flows between a telephone line ring conductor and a customer equipment ring conductor.

17. The integrated semiconductor module of claim 16, wherein said first and second resistors are substantially equal, thereby providing longitudinal balance to a telephone line coupled thereto.

18. The integrated semiconductor module of claim 17, wherein said first and second resistors are each in a range of about 2–20 ohms.

19. The integrated semiconductor module of claim 17, wherein said first and second resistors are formed by respective doped semiconductor areas in said semiconductor material.

20. The integrated semiconductor module of claim 16, wherein, said first and second bidirectional current carrying devices comprise respective triacs which are constructed so as to be driven into conduction in response to an overcurrent condition of about 180 milliamp or greater.

21. The integrated semiconductor module of claim 16, wherein said first and second bidirectional current carrying devices are formed so that each said bidirectional current carrying device can be triggered to an on state in response to an overcurrent without experiencing an. overvoltage of said specified magnitude.

22. The integrated semiconductor module of claim 20, wherein said first and second bidirectional current carrying devices are formed so as tbe triggered into respective on states when an overvoltage condition of said specified magnitude is impressed across said devices, without being triggered to the on state by injecting current into said respective gates.

23. The integrated semiconductor module of claim 16, wherein said first and second bidirectional current carrying devices are structured so that initially said second bidirectional current carrying device will trigger to an on state in response to an overcurrent condition on one conductor of a telephone line, and thereafter said first bidirectional current carrying device will be triggered to an on state in response to the overcurrent condition.

24. The integrated semiconductor module of claim 23, wherein after both said first and second bidirectional current carrying devices have been driven to respective on states, only said first bidirectional current carrying device will remain in an on state for the duration of the overcurrent condition, and the second bidirectional current carrying device will turn off even though the overcurrent condition remains.

25. The integrated semiconductor module of claim 16, wherein the anode of said first bidirectional current carrying device is connected to the anode of said second bidirectional current carrying device.

26. The integrated semiconductor module of claim 16, wherein the cathode and gate of each said first and second bidirectional current carrying device is connected in series with respective conductors of a telephone line to provide overvoltage and overcurrent protection to both said telephone line conductors.

27. The integrated semiconductor module of claim 26, wherein said resistors are in series with the respective conductors of a telephone line.

28. The integrated semiconductor module of claim 16, wherein said module includes five module pins for a telephone line protector.

29. The integrated semiconductor module of claim 28, wherein said module includes a base in which said module pins are mounted, and said first and second bidirectional current casing devices are electrically connected to said module pins.

30. The integrated semiconductor module of claim 29, further including a printed circuit board mounted to said base, said printed circuit board having plural conductive paths each connected to a respective module pin, and wherein said first and second bidirectional current carrying devices are mounted to the conductive paths of said printed circuit board.

31. The integrated semiconductor module of claim 29, wherein said first and second bidirectional current carrying devices are the only components mounted to said printed circuit board.

32. An integrated semiconductor device providing overvoltage and overcurrent protection to a conductor, said semiconductor device comprising:
   a semiconductor chip having a cathode contact, an anode contact and a gate contact;
   an overvoltage protection device formed in said semiconductor chip, said overvoltage protection device being fabricated such that when an overvoltage of a specified breakover voltage magnitude is applied between said cathode contact and said anode contact; said overvoltage protection device is driven to a conduction state to provide a current path between said cathode contact and said anode contact; and
   said overvoltage protection deuce being further formed to provide overcurrent protection to said conductor, including a semiconductor resistor associate with said gate and cathode conduits such that when a current exceeding a specified threshold flows in said conductor and though said semiconductor resistor, a gate-cathode junction is forward biased and said overvoltage protection device is driven into the conduction state.

33. The integrated semiconductor device of claim 32, wherein for use in protecting a telephone line conductor, said overvoltage protection device is fabricated to provide said specified breakover voltage magnitude greater than a peak ringing voltage utilized with the telephone line conductor.

34. The integrated semiconductor device of claim 32, wherein for use in protecting a telephone line conductor, said overvoltage protection device is fabricated with a holding current greater than ac and dc information signals carried on the telephone line conductor.

35. The integrated semiconductor device of claim 32, wherein said specified breakover voltage magnitude is established by forming plural buried regions of a given dopant level.

36. The integrated semiconductor device of claim 32, wherein said semiconductor device is packaged with three terminals corresponding to a cathode terminal, an anode terminal and a gate terminal to provide the overvoltage and overcurrent protection without the use of additional external components connected to the three terminals of the package.

37. The integrated semiconductor device of claim 1, further including:.
  a semiconductor chip having a mid-region, an upper base and a lower base formed in said mid-region, an upper emitter formed in said upper base and a lower emitter formed in said lower base, a plurality of buried regions formed in said mid-region providing a desired breakover voltage of said integrated semiconductor device;
  said upper emitter including a first upper emitter, and said upper emitter including a second upper emitter distinct from said first upper emitter;
  a cathode contact formed on said first upper emitter;
  a gate contact formed on said second upper emitter; and
  an anode contact formed on said lower emitter.

38. The integrated semiconductor device of claim 37, wherein said first upper emitter and said lower emitter each have formed therein shorting dots providing conductive paths between the respective upper base region and the cathode contact, and between the lower base region and the anode contact.

39. The integrated semiconductor device of claim 37, further including a shunt semiconductor resistor that shunts current necessary for turn on of a gate-cathode junction to thereby effectively increase a gate current necessary to achieve a predefined magnitude of current carried by said gate contact for turn on of said integrated semiconductor device.

40. The integrated semiconductor device of claim 37, wherein a portion of said first upper emitter is patterned to define a slotted edge.

41. The integrated semiconductor device of claim 37, wherein a portion of said second upper emitter is patterned to define a slotted edge.

42. The integrated semiconductor device of claim 40, wherein the slotted edge of said first upper emitter extends laterally beyond an edge of said cathode contact.

43. The integrated semiconductor device of claim 41, wherein the slotted edge of said second upper emitter extends laterally beyond an edge of said gate contact.

44. The integrated semiconductor device of claim 37, wherein said first upper emitter is rectangular shaped as viewed from a top view, with a smaller rectangular-shaped portion extending from a side edge thereof.

45. The integrated semiconductor device of claim 1, wherein a pair of said integrated semiconductor devices are packaged together in a single package.

46. The integrated semiconductor device of claim 1, further including in combination a five-pin overvoltage protection module having said semiconductor device connected to ones of the pins of said module.

47. The integrated semiconductor device of claim 46, further including a pair of said semiconductor devices connected to the pins of said module.

48. The integrated semiconductor device of claim 15, further including:
  a semiconductor chip having a mid-region, an upper base and a lower base formed in said mid-region, an upper emitter formed in said: upper base and a lower emitter formed in said lower base, a plurality of buried regions formed in said mid-region providing a desired breakover voltage to said semiconductor device;
  said upper emitter including a first upper emitter, and said upper emitter including a second upper emitter distinct from said first upper emitter;
  a cathode contact formed on said first upper emitter;
  a gate contact formed on said second upper emitter; and
  an anode contact formed on said lower emitter.

49. The integrated semiconductor device of claim 48, wherein said first upper emitter and said lower emitter each have formed herein shorting dots providing conductive paths between the respective upper base region and the cathode contact, and between the lower base region and the anode contact.

50. The integrated semiconductor device of claim 48, wherein including a shunt semiconductor resistor that shunts current necessary for turn on of a gate-cathode junction to thereby effectively increase a gate current necessary to achieve a predefined magnitude of current carried by said gate contact for turn off of said semiconductor, device.

51. The integrated semiconductor device of claim 48, wherein a portion of said first upper emitter is patterned to device a slotted edge.

52. The integrated semiconductor device of claim 48, wherein a portion of said second upper emitter is patterned to define a slotted edge.

53. The integrated semiconductor device of claim 51, wherein the slotted edge of said first upper emitter extends laterally beyond an edge of said cathode contact.

54. The integrated semiconductor device of claim 52, wherein the slotted edge of said second upper emitter extends laterally beyond an edge of said gate contact.

55. The integrated semiconductor device of claim 48, wherein said first upper emitter is rectangular shaped as viewed from a top view, with a smaller rectangular-shaped portion extending from a side edge thereof.

56. The integrated semiconductor device of claim 15, wherein a pair of said integrated semiconductor devices are packaged together in a single package.

57. The integrated semiconductor device of claim 15, further including in combination a five-pin overvoltage protection module having said semiconductor device connected to ones of the pins of said module.

58. The integrated semiconductor device of claim 57, further including a pair of said semiconductor devices connected to the pins of said module.

59. The integrated semiconductor device of claim 32, wherein said semiconductor resistance includes a shunt resistor that prevents current flowing therethrough from forward biasing a gate-cathode junction of said semiconductor device.

60. The integrated semiconductor device of claim 59, wherein said shunt resister is formed in said semiconductor chip to increase a gate-cathode current necessary to achieve said specified threshold.

61. The integrated semiconductor device of claim 32, wherein said semiconductor device is formed to provide bidirectional current carrying capabilities.

62. An integrated semiconductor device providing overvoltage and overcurrent protection to a conductor, comprising:
  a semiconductor chip having a cathode contact a gate contact and an anode contact;
  said semiconductor chip formed to define a thyristor between said cathode contact and said anode contact such that an overvoltage of a specified breakover voltage magnitude coupled between the cathode contact and the anode contact drives said thyristor into conduction irrespective of a gate current applied to said gate contact; and
  said semiconductor chip formed so that a gate current exceeding a specified threshold drives said thyristor into conduction, a gate-cathode junction of said semiconductor device formed so that the magnitude of current flowing in said conductor flows into the gate contact of said semiconductor device.

63. The integrated semiconductor device of claim 62, wherein said anode contact is connected to a circuit common potential, and said conductor comprises two parts, one part connected to said gate contact and another part connected to said cathode contact.

64. The integrated semiconductor device of claim 62, further including a semiconductor resistor formed in said semiconductor chip so that a portion of the current flowing in said gate contact is effective to drive said thyristor into conduction, and a remainder of the current flowing in said gate contact is shunted and is not effective to drive said thyristor into conduction.

65. The integrated semiconductor device of claim 62, further including in combination a five-pin protection module, and said semiconductor device is mounted between ones of the pins of said module.

66. A method of making an integrated semiconductor device providing overvoltage and overcurrent protection to a conductor, comprising the steps of:

forming a voltage sensitive device in a semiconductor material, said voltage sensitive device having a cathode terminal and an anode terminal, and forming said voltage sensitive device such that when a voltage exceeding a predefined threshold is impressed across said cathode terminal and said anode terminal, said voltage sensitive device is triggered into conduction;

forming at current sensitive device in said semiconductor material, said sensitive device having a gate terminal;

forming a semiconductor region with a resistance between said gate terminal and said cathode terminal, whereby a current of a predefined magnitude flowing in said conductor also flows through said semiconductor region; and forming said current sensitive device so that a current of said predefined magnitude flowing through said semiconductor region generates carriers which trigger said voltage sensitive device into conduction.

67. The method of claim 66, further including forming a geometry of said semiconductor region so that when current carried by the conductor is less than said predefined magnitude, insufficient carriers are generated for sustaining conduction of said voltage sensitive device.

68. The method of claim 66, further including forming said semiconductor region between said gate terminal and said cathode terminal with a resistance less than about 20 ohms.

69. The method of claim 66, further including forming said semiconductor device to exhibit a switching current $I_s$ above a magnitude exceeding about 150 milliamp, and to exhibit a holding current $T_h$ above a magnitude exceeding about 150 milliamp.

70. The method of claim 66, further including forming two said semiconductor devices together in a single chip of semiconductor material so that a respective resistance of a corresponding pair of semiconductor regions is substantially equal, thereby providing longitudinal balance between a corresponding pair of conductors.

* * * * *